US008810283B2

(12) United States Patent
Hensley et al.

(10) Patent No.: US 8,810,283 B2
(45) Date of Patent: Aug. 19, 2014

(54) CMOS TRANSISTOR LINEARIZATION METHOD

(75) Inventors: Joseph M. Hensley, Lexington, NC (US); Franklin M. Murden, Roan Mountain, TN (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/477,838

(22) Filed: May 22, 2012

(65) Prior Publication Data

US 2013/0314128 A1 Nov. 28, 2013

(51) Int. Cl.
*G11C 27/02* (2006.01)

(52) U.S. Cl.
USPC .............. 327/93; 327/94; 327/96; 327/534

(58) Field of Classification Search
CPC .............. H01L 27/105; H01L 27/0928; H01L 21/823892
USPC ......... 327/93, 91, 94, 96, 534, 535, 536, 537, 327/530, 589, 390; 257/371, E27.067
See application file for complete search history.

(56) References Cited

U.S. PATENT DOCUMENTS

| | | | | |
|---|---|---|---|---|
| 4,409,496 | A * | 10/1983 | Baba | 327/536 |
| 4,791,317 | A * | 12/1988 | Winnerl et al. | 327/545 |
| 4,798,974 | A * | 1/1989 | Reczek et al. | 327/546 |
| 5,220,534 | A * | 6/1993 | Loh et al. | 365/226 |
| 5,497,023 | A * | 3/1996 | Nakazato et al. | 257/394 |
| 5,557,231 | A * | 9/1996 | Yamaguchi et al. | 327/534 |
| 5,946,229 | A | 8/1999 | Kobatake et al. | |
| 5,952,871 | A * | 9/1999 | Jeon | 327/535 |
| 5,959,504 | A | 9/1999 | Wang | |
| 6,118,326 | A | 9/2000 | Singer et al. | |
| 6,242,969 | B1 | 6/2001 | Sher | |
| 6,373,321 | B1 * | 4/2002 | Yamauchi et al. | 327/534 |
| 6,483,374 | B1 * | 11/2002 | Mizuno et al. | 327/534 |
| 6,603,453 | B2 | 8/2003 | Yamazaki et al. | |
| 6,724,236 | B1 * | 4/2004 | Sarraj | 327/390 |
| 7,030,681 | B2 * | 4/2006 | Yamazaki et al. | 327/534 |
| 7,830,199 | B2 | 11/2010 | Brunsilius et al. | |
| 7,852,704 | B2 | 12/2010 | Takahashi et al. | |
| 2001/0001230 | A1 * | 5/2001 | Proebsting | 327/536 |
| 2003/0016070 | A1 * | 1/2003 | Yang | 327/390 |
| 2003/0151430 | A1 * | 8/2003 | Hakkarainen et al. | 327/94 |
| 2004/0257145 | A1 * | 12/2004 | Yang | 327/390 |
| 2008/0056044 | A1 | 3/2008 | Tomita | |
| 2010/0052957 | A1 | 3/2010 | Craninckx | |
| 2010/0207792 | A1 | 8/2010 | Louwsma et al. | |

OTHER PUBLICATIONS

PCT Interanational Search Report and Written Opinion for PCT/US2013/040027, mailed on Sep. 6, 2013, 13 pages.

* cited by examiner

*Primary Examiner* — Lincoln Donovan
*Assistant Examiner* — Jung H Kim
(74) *Attorney, Agent, or Firm* — Kenyon & Kenyon LLP

(57) ABSTRACT

A circuit for sampling an analog input signal may include a transistor disposed on a substrate and a sampling capacitor coupled to one of the source and the drain of the transistor. The transistor may be disposed on a substrate that is coupled to ground. A source and a drain of the transistor may be disposed in a back gate of the transistor. The analog input may be supplied to one of the source and the drain of the transistor, and the back gate may receive a back gate voltage having a value that is lower than ground.

12 Claims, 4 Drawing Sheets

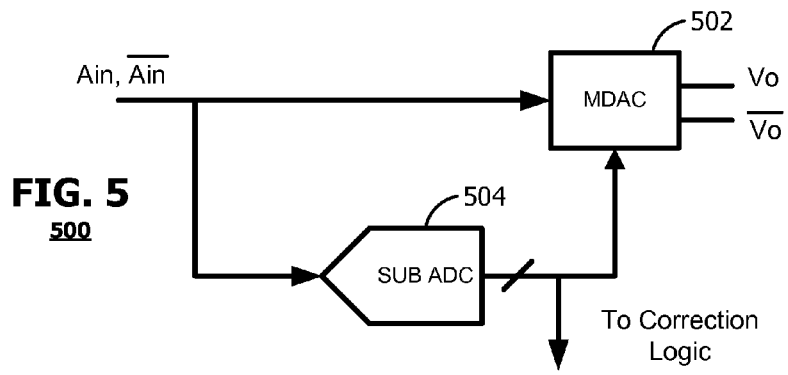
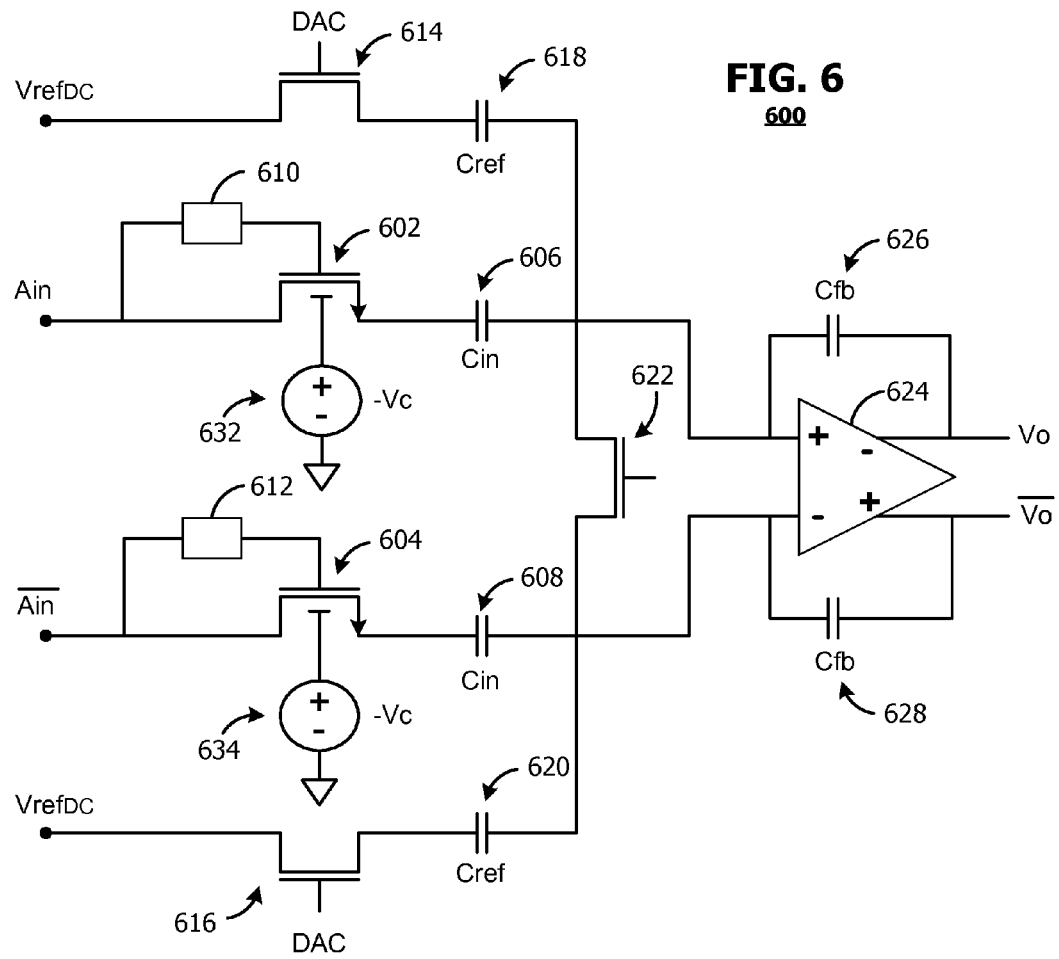

700

800

CMOS TRANSISTOR LINEARIZATION METHOD

BACKGROUND

The subject matter of this application is directed to a metal-oxide-semiconductor field-effect transistor (MOSFET) sampling switch and particularly to a MOSFET sampling switch that reduces parasitic capacitance in PMOS or NMOS transistors.

MOSFETs are widely used in many type of digital and analog circuits. The two type of MOSFETS widely used in the industry are NMOSFET (n-type MOSFET, NMOS, or NFET) and PMOSFET (p-type MOSFET, PMOS, or PFET). PMOS and NMOS transistor can be included in a complementary metal-oxide-semiconductor (CMOS) which typically uses both complementary and symmetrical pairs of PMOS and NMOS transistors. CMOS device are used in many types of analog circuits because the characteristics of the circuit can be controlled by changing the size of the components in the transistors and because the transistors provide nearly ideal switching characteristics.

PMOS and NMOS transistors have been used in circuits that integrate digital and analog functions. For example, PMOS and NMOS transistors have been used in switched-capacitor circuits to perform voltage sampling of time varying voltages. The voltage sampling of the time varying voltage can be achieved by coupling a switch, implemented by at least one of PMOS and NMOS transistor, to a sampling capacitor. The input signal can be coupled to the capacitive storage element by turning "on" and "off" the switch. These switches can be turned "on" and "off" by controlling the voltage applied to the gate electrode of the PMOS or NMOS transistor. Switched-capacitor circuits can be used in gain stages, comparators, filters, digital-to-analog converters (DACs), analog-to-digital converter (ADCs), sample-and-hold amplifiers (SHAs) and in many other applications.

Advances in manufacturing techniques to produce smaller MOSFET devices have allowed MOSFETs to be used in applications needing higher processing speed, reduced power consumption, and reduced space consumption. For example, reduction in the size of MOSFETs typically decreases the supply voltage because a smaller gate drive voltage can be used to control the MOSFET. However, reducing the size of the MOSFETS does not eliminate all of the design challenges and can introduce new challenges. For example, although the "on" resistance in the transmission gate, between the source and the drain of the transistor, of the MOSFET may decrease due to decreased process geometry, the "on" resistance may still affect the operation of the transistors. Furthermore, when a voltage is applied to the gate, to turn "on" the MOSFET, the "on" resistance of the MOSFET is a nonlinear function of the signal voltage coupled by the MOSFET.

In addition, MOSFET devices have parasitic capacitances that can be formed at the borders between the different regions of the MOSFET device. For example, parasitic capacitances can be formed between the gate and a back gate, between the source and the gate, between the source and the back gate, between the drain and the gate, and between the drain and the back gate. In particular, when the MOSFET device is in the "on" state, the signal voltage coupled by the MOSFET device will see an undesired reverse depletion capacitance between the drain of the MOSFET device and a substrate on which the MOSFET is manufactured (back gate) and between the source of the MOSFET device and the substrate (back gate). These parasitic capacitances can induce frequency-dependent and voltage-dependant corruptions and introduce signals passing though the transistors which can lead to signal error in the circuits that use them.

Accordingly, the inventors have identified a need in the art to minimize the influence of parasitic capacitances on circuit performance. In particular, the inventors have identified a need in the art to minimize the influence of parasitic capacitances due to the junction capacitance between the drain and the substrate and between the source and the substrate.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

FIG. 5 is a diagram of an exemplary circuit of a single stage of the pipeline ADC that may find application with a circuit according to an exemplary embodiment of the present disclosure.

FIG. 6 is a diagram of an exemplary circuit of an multiplying ADC (MDAC) that may find application with a circuit according to an exemplary embodiment of the present disclosure.

DETAILED DESCRIPTION

Embodiments of the present invention include a transistor switch having terminals for a gate voltage, source voltage, drain voltage and back gate voltage. A control voltage may be applied to the gate terminal to switch the transistor on and off. An input signal may be applied to the source terminal that is to be conducted to the drain terminal when the transistor is switched on; ideally the input signal is to be conducted to the drain terminal without modification or corruption. A back gate voltage may be tied to a reference potential that exceeds a limit voltage of the input signal applied to the source, which may minimize inherent capacitances present in the transistor device. For an NMOS transistor, where the low voltage limit of the input signal would be ground, the back gate reference potential may be a voltage lower than ground. For a PMOS transistor, where the high voltage limit of the input signal would be VDD, the back gate reference potential may be a voltage higher than VDD. In this manner, parasitic capacitances of the transistor device may be reduced which may lead to lower corruption of an input signal as it passes through the device.

In other embodiments, a bootstrap circuit may be included between the source terminal and the gate of the transistor to minimize the effect of nonlinear "on" resistance in the transistor. The combination of applying a back gate voltage to the back gate and coupling the bootstrap circuit to the transistor can reduce the changes in the RC setting time of a circuit including the transistor. Distortions of the input signal due to high frequencies of the input signals and the nonlinear nature of the "on" resistance and the inherent capacitances may also be reduced by applying a voltage to the back gate of the transistor and coupling a bootstrap circuit between the source terminal and the gate of the transistor.

Figure 1:
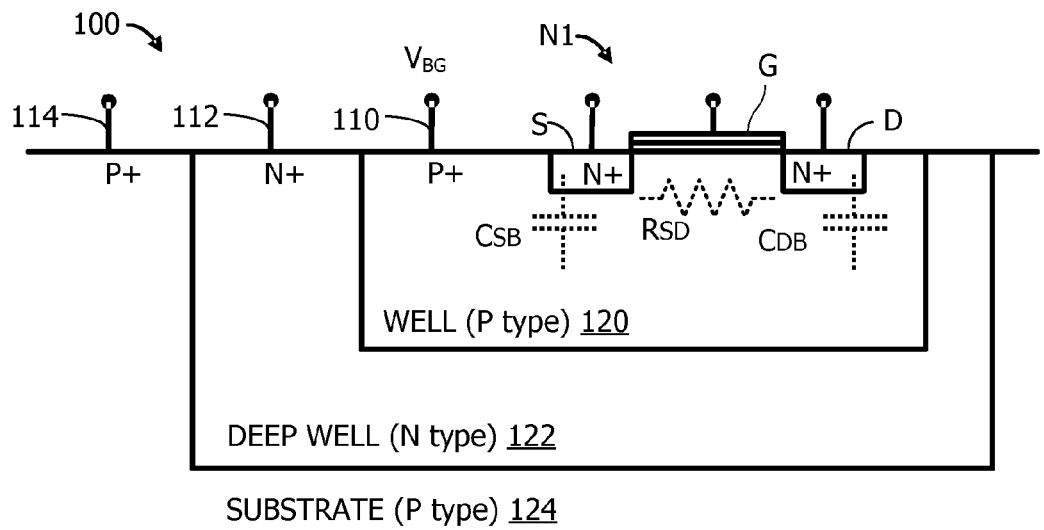
FIG. 1 illustrates a cross-sectional view of a circuit structure having an NMOS transistor with a drain and source contained in a p-well formed above a deep n-well.

FIG. 1 illustrates an NMOS transistor N1 according to an embodiment of the present invention. The NMOS transistor N1 may include a source S, drain D and a gate G. The source S and drain D each may include a region of N type material disposed within a well 120 of P type material. The gate G may be formed over a portion of the well 120 connecting the source S and the drain D. The well 120 may be formed within another well 122 of N type materials (called, the "deep well") which, in turn, may be formed within a substrate 124 of P type material. Terminals 112 and 114 may be included to provide connections to the deep well 122 and the substrate 124, respectively.

FIG. 1 also illustrates a pair of virtual capacitors CSB and CDB. The virtual capacitors CSB and CDB represent parasitic capacitances that are formed between each of the source and drain regions and the well 120. Parasitic capacitance CSB may appear between the source region S and the well 120. Parasitic capacitance CDB may appear between the drain region D of and the well 120. These parasitic capacitances CSB and CDB are inherent properties of transistor devices. The parasitic capacitance may arise from junction capacitances, charge storage capacitances, diffusion capacitances and/or reverse depletion capacitance within the device.

In an embodiment of the present invention, the transistor N1 may include a back gate terminal 110 for application of a bias voltage to the well 120. The back gate bias voltage VBG may be set to a value that is lower than ground (e.g., VBG<VSS). By biasing the back gate terminal 110 and, by extension the well 120, at the negative voltage, parasitic capacitances CSB and CDB within the transistor structure are reduced. High frequency signals passing through the transistor structure from the source to drain terminals likely will exhibit lower corruption effects.

As discussed, FIG. 1 illustrates a structure for an NMOS transistor N1. The principles of the present invention also find application with PMOS transistors (not shown). In such applications, materials shown in FIG. 1 would be reversed. That is, the source S, drain D and deep well 122 each would be made of P type materials (not shown) rather than N type materials as shown in FIG. 1. Further, the well 120 and substrate 124 each would be made of N type materials (not shown) rather than P type materials as shown in FIG. 1.

In a PMOS transistor (not shown), a back gate voltage may be applied that exceeds a high reference potential that is used within the integrated circuit (e.g., VBG>VDD). In this manner, parasitic capacitances CSB and CDB that are formed between the source region and the N-well region and between the drain region and the N-well region would be reduced.

Figure 2:
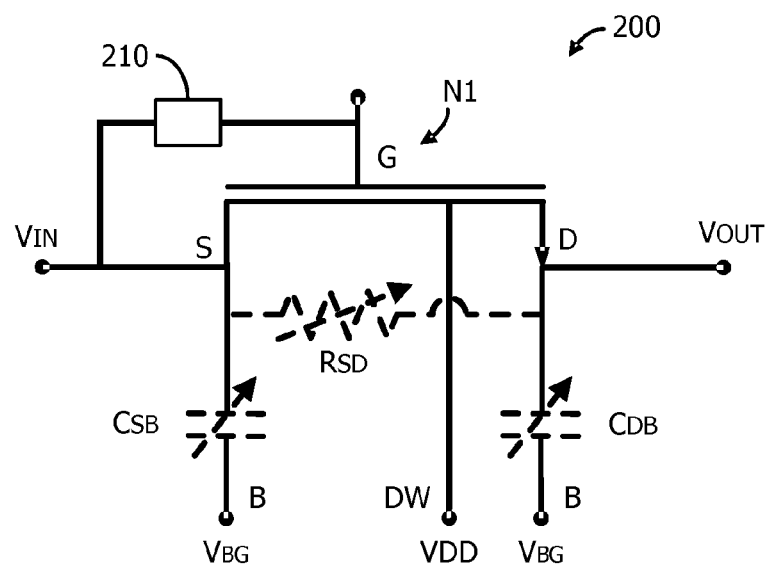
FIG. 2 is a circuit schematic illustrating an NMOS transistor, according to an embodiment of the present invention.

FIG. 2 is a circuit schematic 200 illustrating an NMOS transistor N1, according to an embodiment of the present invention. The NMOS transistor N1 may have terminals representing the gate G, source S, drain D, back gate B (for the well 120, shown in FIG. 1), and deep well DW. An input voltage VIN may be applied to the terminal representing the source S and an output voltage VOUT may be applied to the terminal representing the drain D. The gate G of the NMOS transistor N1 may receive a voltage to control the "on" and "off" state of the transistor.

Circuit 200, shown in FIG. 2, may include a parasitic capacitor CSB coupled between the source S and the back gate B of the NMOS transistor N1, and a parasitic capacitor CDB coupled between the drain D and the back gate B of the NMOS transistor N1. As shown in FIG. 2, parasitic capacitors CSB and CDB are shown as having variable capacitances to indicate the non-linear nature of these components. As discussed above, the non-linear nature of capacitors CSB and CDB may be caused by a changing amplitude or frequency of VIN (input signal coupled by the NMOS transistor N1).

An upper supply voltage VDD may be applied to the deep well DW. The upper supply voltage VDD can be the high voltage limit of the input signal. Although not shown in FIG. 2, the substrate 124 (shown in FIG. 1) may be connected to the lower supply voltage VSS. The lower supply voltage VSS can be either ground or a negative supply voltage lower than ground.

A back gate bias voltage VBG may be applied to the back gate. The back gate bias voltage VBG may be set to a value that is lower than ground (e.g., VBG<VSS). By biasing the back gate, parasitic capacitances CSB and CDB within the transistor structure can be reduced. Thus, reducing the effect of the non-linear nature of parasitic capacitances CSB and CDB. In a PMOS transistor (not shown), a bias voltage VBG may be applied that exceeds a high reference potential that is used within the integrated circuit (e.g., VBG>VDD).

Simulation results of the exemplary embodiments demonstrate that, when a back gate bias voltage VBG is applied to the back gate B of a transistor that is lower than ground, the capacitance of the parasitic capacitors can be reduced. The results show a greater reduction in the parasitic capacitances CSB and CDB when a back gate bias voltage VBG is set to a value that is lower than ground (e.g., VBG<VSS) as compared to when the back gate is coupled to the ground (e.g., VBG=VSS). Furthermore, simulation results show that the dependence of the parasitic capacitance on a voltage of the input signal is reduced when the back gate bias voltage VBG is set to a value that is lower than ground. In particular, as the value of the input signal is varied, the derivative of the parasitic capacitance CSB and CDB has a smaller slope as compared to the derivative of the parasitic capacitance CSB and CDB when zero volts is applied to the back gate B.

Thus, coupling the back gate B of the transistor to a voltage value that is lower than ground, may reduce the reverse bias depletion capacitance represented by parasitic capacitance CSB and CDB. Applying a lower voltage than ground to the back gate B may increase a threshold voltage of the transistor. Although a resistance of the transistor may increase due to an increase in threshold voltage, the reduction in distortion due to parasitic capacitance to the signal voltage coupled by the transistor N1 outweighs the drawbacks of slight increase in the transistor resistance. In particular, the advantages of reducing the parasitic capacitances outweigh the slight increase in the transistor resistor at higher frequencies because distortion due to parasitic capacitance may be dominant at higher frequencies.

The advantages of applying a back gate bias voltage VBG to the back gate B of a transistor that is lower than ground may be more evident as the size of the transistors is reduced because applying a voltage to the back gate B of these transistors does not significantly effect the threshold voltage of the transistor. In fine line CMOS technologies such as 65 nm and beyond, the body effect in transistors can be very weak. Thus, changing the back gate bias voltage VBG may have minimal effect on the threshold voltage of a transistor. However, using 180 nm CMOS technologies designers can change the threshold voltage by changing the back gate bias voltage VBG. Thus, applying a voltage to the back gate of a transistor using 180 nm, will not only change the effect of the parasitic capacitance but will also change the threshold voltage of the transistor.

The back gate bias voltage VBG may be applied to the back gate B at predetermined periods during the operation of the transistor or could be applied continuously during the operation of the circuit having the transistor. For example, the predetermined period could be the time at which the transistor is controlled to be on. The voltage source for back gate bias voltage VBG can be a voltage source that is part of the circuit including the transistor or can be an external voltage source.

The back gate bias voltage VBG applied to the back gate B can be a predetermined voltage that minimized the effect of parasitic capacitances CSB and CDB. For example, a back gate bias voltage VBG of negative 1V can be applied to the of the back gate B to reduce the effect of parasitic capacitances CSB and CDB.

As shown in FIGS. 1 and 2, the transistor N1 may include virtual non-linear resistance RSD. The resistance RSD represents the non-linear nature of the "on" resistance of transistor N1. The resistance RSD can be non-linear because when a voltage is applied to the gate, to turn "on" the transistor, the "on" resistance of the transistor is a nonlinear function of the signal voltage coupled by the transistor. Thus, the non-linear nature of resistance RSD may changes the operation characteristics of the transistor when the transistor is "on."

The nonlinear nature of resistance RSD may be controlled by bootstrapping the gate drive voltage to a boosted level of the input voltage VIN. FIG. 2 shows an optional bootstrapped circuit 210 that may be included to minimize the effect of the nonlinear nature of resistance RSD. Examples of such circuits can be found, for example, in U.S. Pat. No. 6,118,326. In these circuits, if a supply voltage provided to the gate of the transistor to turn "on" the transistor exceeds a voltage of the input voltage VIN, then the supply voltage may be provided to the gate of the transistor without exceeding the breakdown voltage of the transistor. If the supply voltage provided to the gate of the transistor to turn "on" the transistor is below the input voltage VIN, then the gate drive voltage provided to the gate of the transistor to turn "on" the transistor is equal to the value of the input voltage VIN plus a fixed voltage. The fixed voltage may be a bias voltage or the supply voltage. This gate drive voltage provides a substantially constant gate-to-source voltage VGS in the transistor, which is equal to the fixed voltage and substantially independent of the input voltage VIN. The constant gate-to-source voltage VGS may result in a substantially constant "on" resistance. The bootstrap circuit may use a boost capacitor which is charged to a supply voltage in one mode and stacked on the input voltage VIN to provide a fixed gate voltage to maintain a near constant conduction over the input range.

The bootstrap circuit may be used to provide a constant "on" resistance in combination with applying a back gate bias voltage VBG to the back gate to reduce the parasitic capacitance CSB and CDB.

Figure 3:
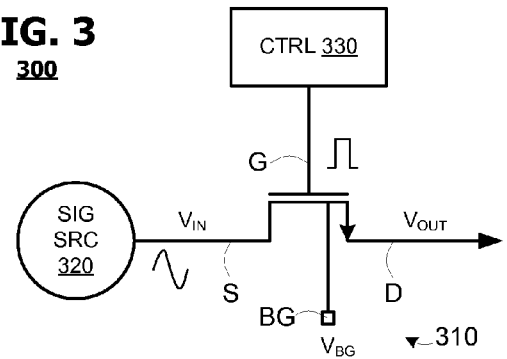
FIG. 3 is a diagram of a circuit including a transistor coupling an input signal, according to an embodiment of the present invention.

FIG. 3 is a diagram of a circuit 300 including a transistor 310 coupling an input signal VIN. The transistor 310 may receive an input signal VIN from a signal source 320 at the source S of the transistor 310 and couple the input signal VIN to the drain D of the transistor 310. The coupling of the input signal VIN may be controlled by a control signal, from a controller 330, applied to the gate G of the transistor. A back gate bias voltage VBG may be applied to the back gate BG of the transistor 310. Input signal VIN from the signal source 320 may vary between a high voltage limit and a low voltage limit. The back gate bias voltage VBG applied to the back gate BG may be a value that is lower than the low voltage limit of the input signal VIN or a value that is higher than the high voltage limit of the input signal VIN. The back gate bias voltage VBG may be a value that is lower than the low voltage limit of the input signal VIN in the case of a NMOS transistor. The back gate voltage VBG may be a value that is higher than the high voltage limit of the input signal VIN in the case of a PMOS transistor.

Figure 4:
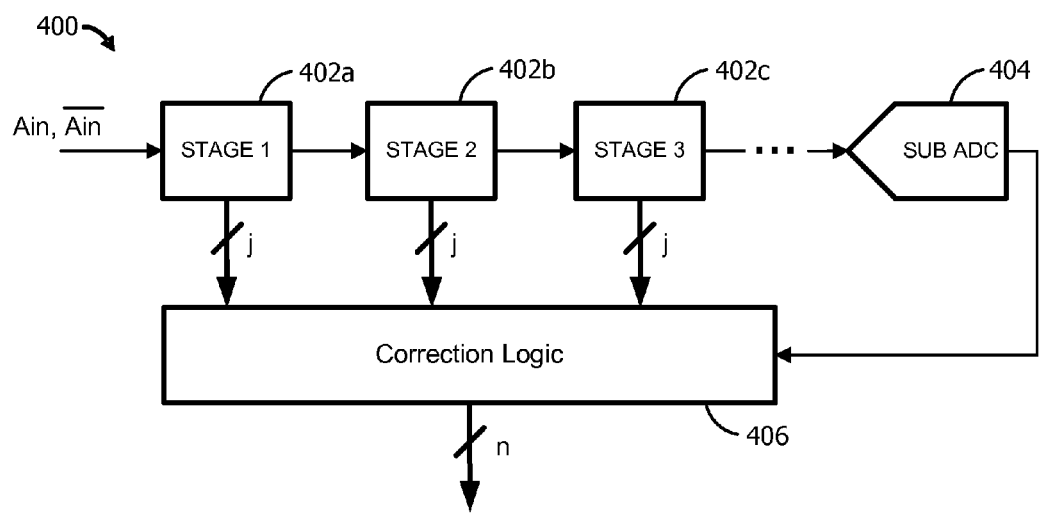
FIG. 4 is a diagram of an exemplary circuit of a pipeline analog to digital converter (ADC) that may find application with a circuit according to an embodiment of the present disclosure.

FIG. 4 is a diagram of an exemplary circuit of a pipeline analog to digital converter (ADC) 400 that may find application with a circuit according to an exemplary embodiment of the present disclosure. The pipeline ADC 400 may include a series of stages 402a, 402b and 402c, SUB ADC 404 and correction logic 406.

The pipeline ADC 400 may receive an analog input signal Ain in the first stage 402a. The pipeline ADC 400 may also receive a compliment of the input signal Ain. The analog input signal Ain may be sampled and held in the first stage 402a. The first stage 402a may process the signal and outputs an output residue voltage Vo that is passed to the next stage and may output a low-resolution digital code to the correction logic 402. Each of the stages 402a, 402b and 402c may resolve a number of bits. The output residue voltage Vo in the last stage may be output to a SUB ADC 404 that resolves the last bits. The SUB ADC 404 may be a flash ADC. The correction logic 406 may receive the digital code from each of the stages 402a, 402b and 402c, and the SUB ADC 404. The correction logic 406 can correct for errors made in the stages 402a, 402b and 402c.

FIG. 5 is a diagram of an exemplary circuit of a single stage 500 of the pipeline ADC 400 that may find application with a circuit according to an exemplary embodiment of the present disclosure. The single stage 500 of the pipeline ADC 400 may include a multiplying ADC (MDAC) 502 and a sub ADC 504. The input signal Ain sent to the single stage 500 may be supplied to the MDAC 502 and the sub ADC 504. The sub ADC 504 may convert the input Ain into a low-resolution digital code. The output from the sub ADC 504 may be output to the correction logic 406 (shown in FIG. 4) and to the MDAC 502. The MDAC 502 may convert the output of the sub ADC 504 into an analog signal which is subtracted from the input signal Ain to obtain a residual signal. The residual signal from the MDAC 502 may be fed to the next stage in the pipeline ADC 400.

FIG. 6 is a diagram of an exemplary circuit of an MDAC 600 that may find application with a circuit according to an exemplary embodiment of the present disclosure. The circuit of an MDAC 600 may include sampling transistors 602 and 604 coupled to sampling capacitors 606 and 608, respectively, bootstrap circuits 610 and 612 coupling the source and the gate of transistors 602 and 604, respectively, transistors 614 and 616 coupling Vrefdc to capacitors 618 and 620, respectively, transistor 622, preamplifier 624 and feedback capacitors 626 and 628. The back gates of sampling transistors 602 and 604 may be coupled to voltage sources 632 and 634, respectively.

The MDAC 600 may sample the input signal Ain and generate a residue voltage Vo that is sent to the next stage in the pipeline ADC 400. The MDAC 600 may sample the input signal Ain and compare the input signal Ain to a reference voltage Vrefdc supplied via capacitors 618 and 620. If the sampled input signal is lower than the reference voltage Vrefdc then the sampled input signal can be output as residue voltage Vo, after being amplified by preamplifier 624. However, if the sampled input signal is higher than the Vrefdc then the reference voltage Vrefdc can be subtracted from the sampled input signal and amplified by preamplifier 624 before being output as residue voltage Vo. The residue that is generated by the MDAC is propagated to the next stage of the pipeline ADC 400.

As shown in FIG. 6, the MDAC 600 can include switched capacitor circuit including sampling transistor 602 and sampling capacitor 606 or sampling transistor 604 and sampling capacitor 608. The back gates of sampling transistors 602 and 604 may be coupled to voltage sources 632 and 634, respectively, to reduce the parasitic capacitance between the drain and the back gate and the parasitic capacitance between the source and the back gate. Voltage sources 632 and 634 can be configured to supply a value that is lower than ground to the back gates of sampling transistors 632 and 634. As discussed above, a bootstrapping circuits 610 and 612 may be coupled between the nodes receiving the input signals and the gates of sampling transistor 602 and 604 to minimize the nonlinear nature of the "on" resistance of the sampling transistors 602 and 604, respectively.

Figure 7:
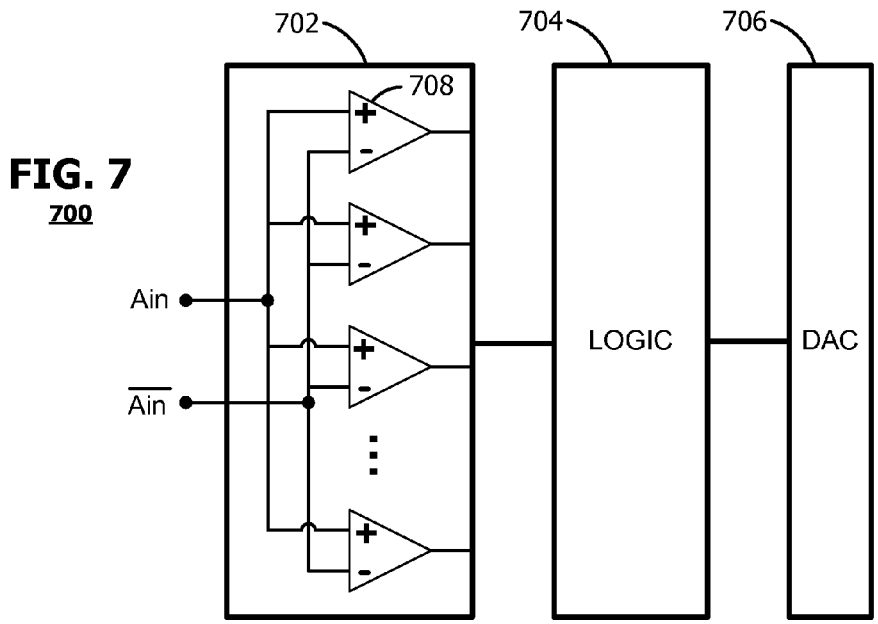
FIG. 7 is a block diagram of an exemplary SUB ADC that may find application according to an exemplary embodiment of the present disclosure.

FIG. 7 is a block diagram of an exemplary SUB ADC 700 that may find application according to an exemplary embodiment of the present disclosure. The SUB ADC 700 may include a parallel ADC block 702 that received input signals and logic 704. The parallel ADC block 702 may be a flash ADC or other types of ADCs. The output from logic 704 may be provided to a digital to analog converter (DAC) 706.

Figure 8:
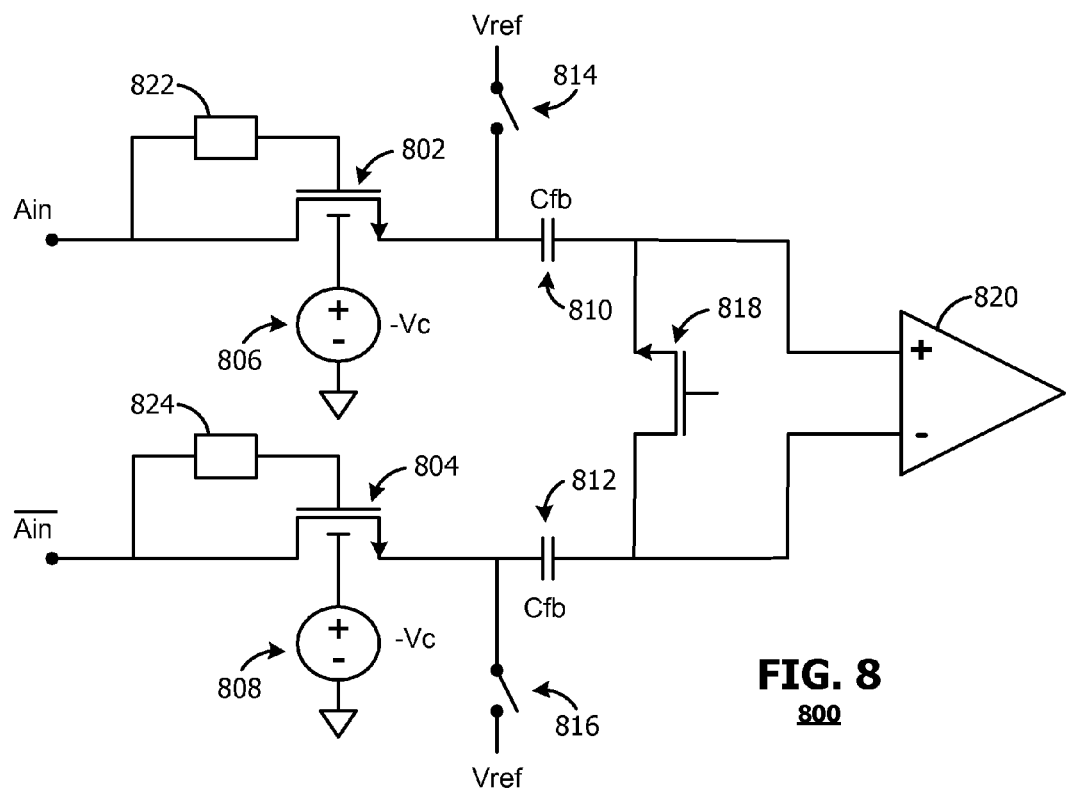
FIG. 8 is a diagram of an exemplary circuit of an SUB ADC that may find application with a circuit according to an exemplary embodiment of the present disclosure.

The parallel ADC block 702 may receive the input signals and compare the analog input signals to a series of reference voltages using comparators 708. FIG. 8 is a diagram of an exemplary circuit of an SUB ADC 800 that may find application with a circuit according to an exemplary embodiment of the present disclosure. The circuit in FIG. 8 may correspond to one or more of the circuits in ADC block 702 sampling the input signals at one or more reference values.

The exemplary circuit of the SUB ADC 800 may include sampling transistors 802 and 804, voltage sources 806 and 808 providing a negative voltage to the back gate of sampling transistors 802 and 804, respectively, feedback capacitors 810 and 812, switches 814 and 816 controlling the supply of reference voltage Vref, transistor 818 and comparator 820. The SUB ADC 800 may include bootstrap circuits 822 and 824 coupling the source and the gates of transistors 802 and 804, respectively.

As shown in FIG. 8, the SUB ADC 800 may include voltage sources 806 and 808 coupled to the back gates of the sampling transistors 802 and 804, to reduce the parasitic capacitance between the drain and the back gate and the parasitic capacitance between the source and the back gate. Voltage sources 806 and 808 may supply a value that is lower than ground to the back gate of sampling transistors 802 and 804.

As discussed above, a bootstrapping circuits 822 and 824 may optionally be coupled between the nodes receiving the input signals and the gates of sampling transistor 802 and 804. The bootstrapping circuits 822 and 824 may be included to minimize the nonlinear nature of the "on" resistance of sampling transistor 802 and 804, respectively.

The exemplary embodiments of providing a voltage to the back gate of a transistor can be applied to any circuit having a time varying voltage coupled via the transistor. The transistor can be coupled to a capacitor, an amplifier input, an analog multiplexer, or other devices receiving an output from the transistor.

The exemplary embodiments have been described with reference to a NMOS transistors. However, the exemplary embodiments can be translated to embodiments suitable for use in a switched-capacitor circuits using PMOS transistors. For example, instead of applying a back gate voltage with a value that is lower than ground to the back gate of the NMOS transistor, a back gate voltage may be applied that exceeds a high reference potential that is used within the integrated circuit to the back gate of the PMOS transistor. In addition, a combination of PMOS and NMOS transistors could be used in accordance with the exemplary embodiments.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. A circuit, comprising:
a MOSFET transistor comprising a source terminal, a drain terminal, a gate terminal and a backgate terminal, the gate terminal controlled as an input switch,
a signal source coupled to the source terminal, to generate a continuous time varying input signal that varies between a high and low voltage limit, and
a reference voltage source, coupled to the backgate terminal to provide a reference voltage when the transistor is on and not coupled to the backgate terminal when the transistor is off, wherein the reference voltage exceeds one of the voltage limits of the continuous time varying input signal.

2. The circuit of claim 1, wherein:
the MOSFET transistor is an NMOS transistor, and
the reference voltage source has a voltage that is lower than the low voltage limit of the signal source.

3. The circuit of claim 1, wherein:
the MOSFET transistor is a PMOS transistor, and
the reference voltage source has a voltage that is lower than the high voltage limit of the signal source.

4. The circuit of claim 1, further comprising:
a gate controller, coupled to a gate of the MOSFET transistor, that selectively switches the MOSFET transistor on and off.

5. A circuit for sampling an analog input signal, comprising:
a sampling transistor provided on a substrate that is coupled to ground, a source and a drain disposed in a back gate of the sampling transistor, a gate terminal controlled as an input switch provided over the back gate in a region extending between the source and the drain, the analog input signal supplied to one of the source and the drain of the sampling transistor, and the back gate receiving a back gate voltage having a value that exceeds a voltage limit of the analog input signal, wherein the back gate voltage is provided when the transistor is on and is not provided when the transistor is off; and
a sampling capacitor coupled to one of the source and the drain of the sampling transistor.

6. The circuit for sampling the analog input signal of claim 5, further comprising:
a bootstrapping circuit coupled between the source and a gate of the transistor to reduce the non-linear nature of the on resistance formed between the drain and source of the transistor.

7. The circuit for sampling the analog input signal of claim 5, wherein 65 nm or smaller technologies are used for the transistor.

8. A circuit for comparing an analog input signal to a reference voltage, comprising a transistor receiving a continuous time varying input signal at one of a source and a drain;

a capacitor coupled to the transistor;

a comparator coupled to the capacitor, the comparator comparing the voltage at the capacitor to the reference voltage; and a back gate voltage source coupled to a back gate of the transistor, the back gate voltage source providing a back gate voltage having a value that exceeds a voltage limit of the continuous time varying input signal, wherein the back gate voltage is provided when the transistor is on and is not provided when the transistor is off.

9. The circuit of claim 8, further comprising a bootstrapping circuit coupled between the source and a gate of the transistor to reduce the non-linear nature of the on resistance formed between the drain and source of the transistor.

10. The circuit of claim 5, further comprising:

a reference transistor receiving a reference voltage at one of a source and a drain of the reference transistor;

a reference capacitor coupled to the reference transistor; and a comparator coupled to the sampling capacitor and the reference capacitor, the comparator comparing the voltage of the analog input signal in the sampling capacitor to the reference voltage in the reference capacitor.

11. A circuit for comparing an analog input signal to a reference voltage, comprising a sampling transistor receiving a control signal at a gate terminal and receiving continuous time varying input signal at one of a source and a drain of the sampling transistor;

a first capacitor coupled to the first sampling transistor;

a reference transistor receiving a reference voltage at one of a source and a drain of the reference transistor;

a second capacitor coupled to the reference transistor;

a comparator coupled to the first capacitor and the second capacitor, the comparator comparing the voltage of the continuous time varying input signal at the first capacitor to the reference voltage at the second capacitor; and a back gate voltage source coupled to a back gate of the sampling transistor, the back gate voltage source providing a back gate voltage having a value that exceeds a voltage limit of the continuous time varying input signal, wherein the back gate voltage is provided to the back gate of the sampling transistor when the transistor is activated by the control signal at the gate of the sampling transistor and the back gate voltage is not provided to the back gate of the sampling transistor when the transistor is deactivated by the control signal at the gate of the sampling transistor.

12. The circuit of claim 11, further comprising a bootstrapping circuit coupled between the source and the gate of the sampling transistor to reduce the non-linear nature of the on resistance formed between the drain and source of the transistor.

* * * * *

UNITED STATES PATENT AND TRADEMARK OFFICE
CERTIFICATE OF CORRECTION

PATENT NO. : 8,810,283 B2  
APPLICATION NO. : 13/477838  
DATED : August 19, 2014  
INVENTOR(S) : Hensley et al.

Page 1 of 1

It is certified that error appears in the above-identified patent and that said Letters Patent is hereby corrected as shown below:

In the specification

In column 3, line 31, change "region D of and the well 120" to --region D and the well 120--

In column 6, line 25, change "logic 402" to --logic 406--

In column 7, line 16, change "transistors 632 and 634" to --transistors 602 and 604--

In the claims

In column 8, line 36, change "is lower than" to --is higher than--

Signed and Sealed this  
Tenth Day of November, 2015

Michelle K. Lee  
*Director of the United States Patent and Trademark Office*